United States Patent
Park et al.

(10) Patent No.: US 9,204,583 B2
(45) Date of Patent: Dec. 1, 2015

(54) CYLINDRICAL ELECTROMAGNETIC BANDGAP AND COAXIAL CABLE HAVING THE SAME

(75) Inventors: Hyun Ho Park, Suwon-si (KR); Hark Byeong Park, Hwaseong-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 431 days.

(21) Appl. No.: 13/483,436

(22) Filed: May 30, 2012

(65) Prior Publication Data

US 2012/0312578 A1 Dec. 13, 2012

(30) Foreign Application Priority Data

Jun. 9, 2011 (KR) .................. 10-2011-0055402

(51) Int. Cl.
*H01B 11/00* (2006.01)
*H05K 9/00* (2006.01)

(52) U.S. Cl.
CPC ..................................... *H05K 9/0098* (2013.01)

(58) Field of Classification Search
CPC ......... H05K 9/00; H05K 9/0098; H01B 11/18
USPC ........... 174/68.1, 102 R, 102 C, 104, 350, 32, 174/106 R, 70 R, 102 SP, 108, 33, 36, 34, 174/107; 455/63.1
See application file for complete search history.

(56) References Cited

U.S. PATENT DOCUMENTS

| | | | | |
|---|---|---|---|---|
| 3,963,854 A * | 6/1976 | Fowler | ............................ | 174/36 |
| 4,327,248 A * | 4/1982 | Campbell | ..................... | 174/107 |
| 4,533,784 A * | 8/1985 | Olyphant, Jr. | ................... | 174/36 |
| 4,598,165 A * | 7/1986 | Tsai | ................................ | 174/36 |
| 5,349,133 A * | 9/1994 | Rogers | ............................ | 174/36 |
| 6,284,971 B1 * | 9/2001 | Atalar et al. | ..................... | 174/36 |
| 6,867,362 B2 * | 3/2005 | Cherniski et al. | ............... | 174/36 |
| 7,105,739 B2 * | 9/2006 | Abe | ............................... | 174/28 |
| 7,525,045 B2 * | 4/2009 | Archambeault et al. | .. | 174/102 R |
| 7,737,362 B2 * | 6/2010 | Ogura | ........................ | 174/102 R |
| 8,005,429 B2 * | 8/2011 | Conway et al. | .............. | 455/63.1 |
| 8,492,648 B2 * | 7/2013 | Smith et al. | ...................... | 174/36 |
| 2003/0002691 A1 * | 1/2003 | Ono et al. | ..................... | 381/94.1 |
| 2004/0055772 A1 * | 3/2004 | Tsutsui et al. | ................... | 174/36 |
| 2006/0185884 A1 * | 8/2006 | Ortiz et al. | ................... | 174/74 R |
| 2011/0266050 A1 * | 11/2011 | Su et al. | ...................... | 174/74 R |
| 2012/0273247 A1 * | 11/2012 | Matsuura | .................. | 174/102 R |

\* cited by examiner

*Primary Examiner* — Angel R Estrada
*Assistant Examiner* — Dimary Lopez Cruz
(74) *Attorney, Agent, or Firm* — Staas & Halsey LLP

(57) ABSTRACT

A cylindrical electromagnetic bandgap to reduce electromagnetic interference of a cable and a coaxial cable having the same includes a conductor patch having a curved surface to be spaced apart from the surface of the cylindrical cable to an outer side by a predetermined gap distance, and a via connecting the surface of the cylindrical cable to the conductor patch.

18 Claims, 13 Drawing Sheets

CYLINDRICAL ELECTROMAGNETIC BANDGAP AND COAXIAL CABLE HAVING THE SAME

CROSS-REFERENCE TO RELATED APPLICATIONS

This application claims the priority benefit of Korean Patent Application No. 10-2011-0055402, filed on Jun. 9, 2011 in the Korean Intellectual Property Office, the disclosure of which is incorporated herein by reference.

BACKGROUND

1. Field

The following description relates to a cylindrical electromagnetic bandgap capable of improving electromagnetic interference (EMI) and a coaxial cable having the same.

2. Description of the Related Art

In general, EMI (electromagnetic interference) has been considered a chronic problem in operating an electronic device with a high frequency.

RFI (Radio Frequency Interference) is an electromagnetic interference that occurs inside a product, and such phenomenon particularly reduces the function of wireless reception. The operating frequencies of recent electronic products range from several hundred MHz to several GHz. Accordingly, as various wireless functions such as wireless Internet, GPS, WiFi, or Bluetooth, for example, have been adopted, the effect of an EMI or a RFI has received significant attention.

Also, for electronic products that use RF cables, such as notebook PCs, tablet PCs, or handheld phones, for example, the noise of electromagnetic waves developed inside the system interferes with the cable, resulting in induced common-mode currents that affect a signal received through an antenna, and degrade the reception sensitivity.

SUMMARY

Therefore, it is an aspect of the present disclosure to provide a cylindrical electromagnetic bandgap capable of improving an EMI.

It is another aspect of the present disclosure to provide a coaxial cable, in which a cylindrical electromagnetic bandgap is installed to prevent induced electric current induced on the surface of an outer conductor from flowing to an inner conductor, such that a reception sensitivity is improved.

Additional aspects of the disclosure will be set forth in part in the description which follows and, in part, will be obvious from the description, or may be learned by practice of the disclosure.

In accordance with an aspect of the present disclosure, a cylindrical electromagnetic bandgap, which is provided in a cylindrical shape to prevent a flow of induced currents on a surface of a cylindrical cable, includes a conductor patch and a via. The conductor path has a curved surface to be spaced apart by a predetermined gap distance from the surface of the cylindrical cable to an outer side. The via connects the surface of the cylindrical cable to the conductor patch.

The cylindrical electromagnetic bandgap is provided in a plurality while being spaced apart by a predetermined distance from each other lengthwise along the cylindrical cable.

At least one of a dielectric and a ferrite material is provided between the outer surface of the cylindrical cable and the conductor patch.

A frequency characteristic of the cylindrical electromagnetic bandgap is adjusted according to the change of an area of at least one of the conductor patch and the via.

A frequency characteristic of the cylindrical electromagnetic bandgap is adjusted according to the change in thickness of at least one of the conductor patch and the via.

A frequency characteristic of the cylindrical electromagnetic bandgap is adjusted according to the change in a gap of at least one of the conductor patch and the via.

The cylindrical electromagnetic bandgap is provided in a stacking structure so that a portion of a conductor patch of one cylindrical electromagnetic bandgap overlaps with a portion of a conductor path of another cylindrical electromagnetic bandgap.

In accordance with another aspect of the present disclosure, an electromagnetic bandgap for reducing electromagnetic interference of a cable includes a conductor patch and a via. The conductor patch has a curved surface to be spaced apart by a predetermined gap distance from a surface of the cable to an outer side. The via connects the conductor patch to the cable. The conductor patch is provided in a plurality of cylindrical conductor patches that are arranged at an equal interval and the via is provided in a plurality of cylindrical vias that are arranged at an equal interval.

The electromagnetic bandgap is provided in a plurality of rows of electromagnetic bandgaps while being spaced apart from each other lengthwise along the cable by a predetermined distance.

A frequency characteristic of the electromagnetic bandgap is adjusted according to the change of at least one of area, thickness, and gap distance of the conductor patch or the via.

At least one of a dielectric and a ferrite material is provided between the conductor patch and the cable.

In accordance with another aspect of the present disclosure, a coaxial cable having an inner conductor and an outer conductor provided outside the inner conductor includes a cylindrical electromagnetic bandgap. The cylindrical electromagnetic bandgap is formed at an outer side of the coaxial cable to block noise current induced on a surface of the coaxial cable.

The cylindrical electromagnetic bandgap includes a conductor patch and a via. The conductor patch has a curved surface to be spaced apart by a predetermined gap distance from an outer side of the outer conductor. The via connects the conductor patch to the outer conductor.

Each of the conductor patch and the via is provided in a cylindrical shape such that the cylindrical electromagnetic bandgap covers the cable.

The cylindrical electromagnetic bandgap is provided in a plurality of rows of cylindrical electromagnetic bandgaps that are arranged lengthwise along the cable.

A frequency characteristic of the cylindrical electromagnetic bandgap is adjusted according to the change of at least one of area, thickness, and gap distance of the conductor patch or the via.

At least one of a dielectric and a ferrite material is provided between the outer conductor and the conductor patch.

The cylindrical electromagnetic bandgap is provided in a stacking structure so that a portion of a conductor patch of one cylindrical electromagnetic bandgap overlaps with a portion of a conductor path of another cylindrical electromagnetic bandgap.

According to an embodiment of the present disclosure, the noise current induced on the outer surface of a cylindrical cable is blocked, so that the electromagnetic interference is reduced.

In addition, the noise current induced on the surface of a coaxial cable is blocked from flowing to an inner conductor that is connected to an antenna, thereby preventing signal attenuation or poor reception caused by external electromagnetic noise when signals are transmitted through a coaxial cable and thus improving the reception sensitivity in a RF frequency band.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Figure 1:
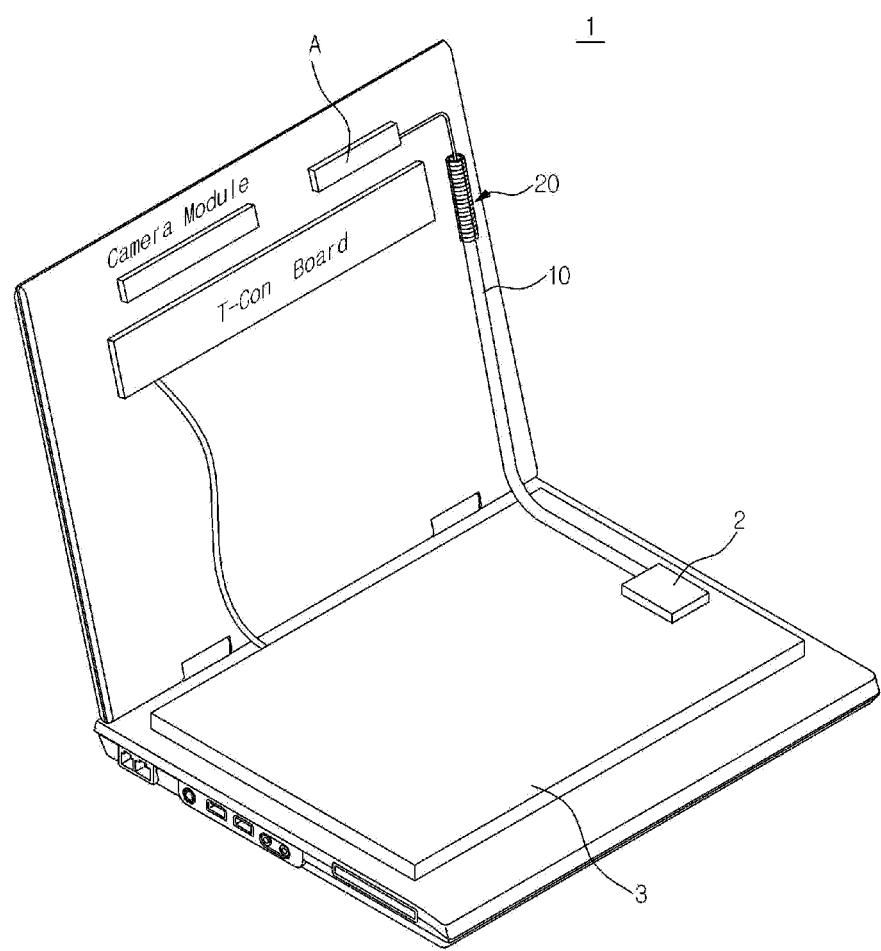
FIG. 1 is a view schematically illustrating a notebook PC in which a cylindrical electromagnetic bandgap, according to an embodiment of the present disclosure, is applied to a coaxial cable.

Reference will now be made in detail to the embodiments of the present disclosure, examples of which are illustrated in the accompanying drawings, wherein like reference numerals refer to like elements throughout.

Figure 2:
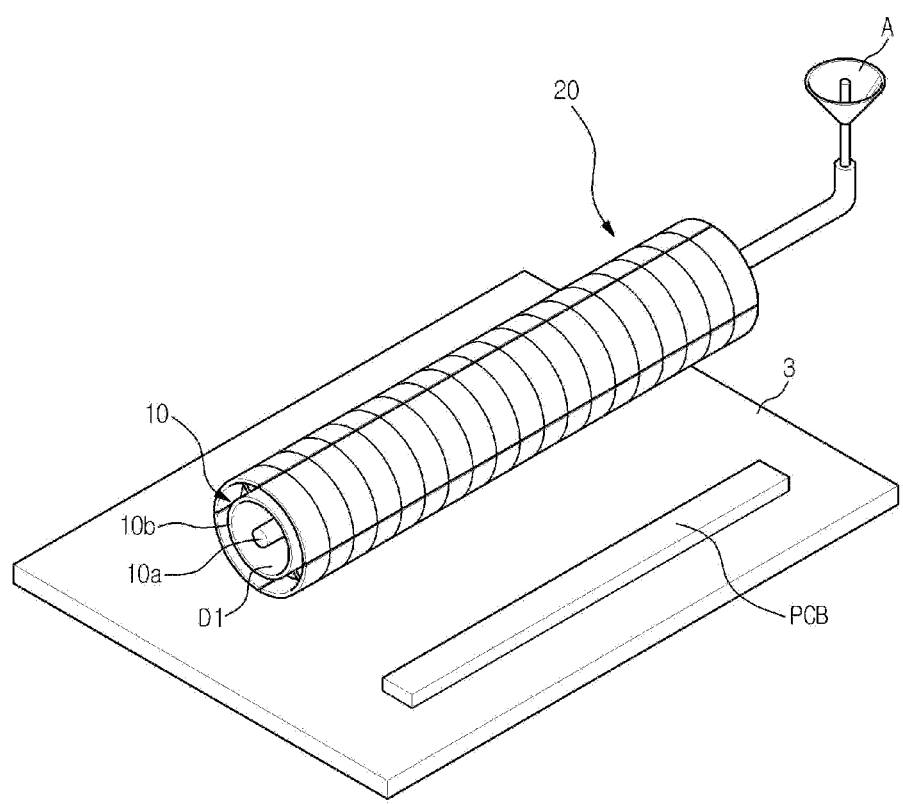
FIG. 2 is a view schematically illustrating a coaxial cable, according to an embodiment of the present disclosure.

As illustrated in FIGS. 1 and 2, a coaxial cable 10 transmits electrical signals from an electronic device 1 (a notebook PC, for example) to an antenna (A). The electronic device is equipped with a main board embodied with a RF circuit, or a digital circuit, for example. The coaxial cable has one end connected to a connector (not shown) attached to a wireless apparatus 2 of a board 3, and the other end connected to the antenna (A).

The coaxial cable 10 is a type of transmission line used for data transmission that can transmit electric signals, because the coaxial cable 10 is formed with an outer conductor 10b and an inner conductor 10a in a concentric circle. The coaxial cable 10 has the ability to transmit low frequency electrical signals and high frequency electrical signals, in addition to direct current.

A dielectric D1 is provided between the outer conductor 10b and the inner conductor 10a of the coaxial cable 10.

However, in the case where the coaxial cable 10 is positioned inside the electronic apparatus 1 where such various circuits and system are provided, noise in the form of electromagnetic waves developed from a PCB located inside the electronic apparatus 1 is conveyed through the surface of the coaxial cable 10 after being induced as noise currents on the coaxial cable 10.

Because the outer conductor 10b is not provided on a connecting portion between the inner conductor 10a of the coaxial cable 10 and the antenna (A), noise in the form of an electromagnetic wave interference is developed inside the inner conductor 10a that affects signals received from the antenna (A), disturbing signal reception.

According to an embodiment of the present disclosure, in order to prevent signal reduction or decreased reception as a result of induced noise currents on a surface of the coaxial cable 10 affecting the inner conductor 10a or the antenna (A), a cylindrical electromagnetic bandgap 20 is installed on the coaxial cable 10.

Figure 3:
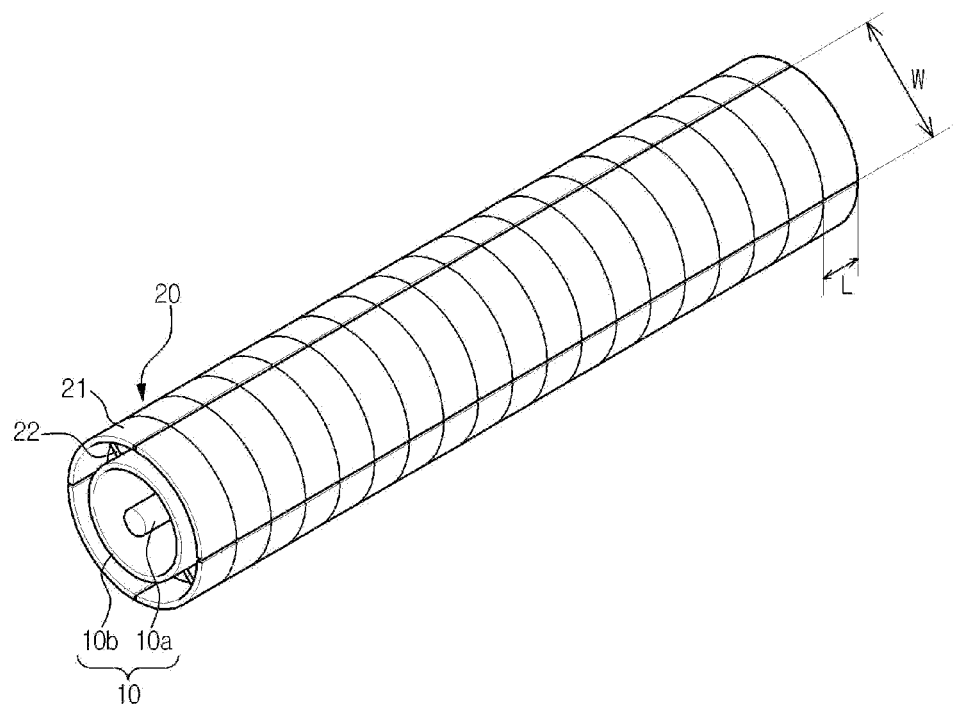
FIG. 3 is a view schematically illustrating the coaxial cable using the cylindrical electromagnetic bandgap, according to an embodiment of the present disclosure.
Figure 4:
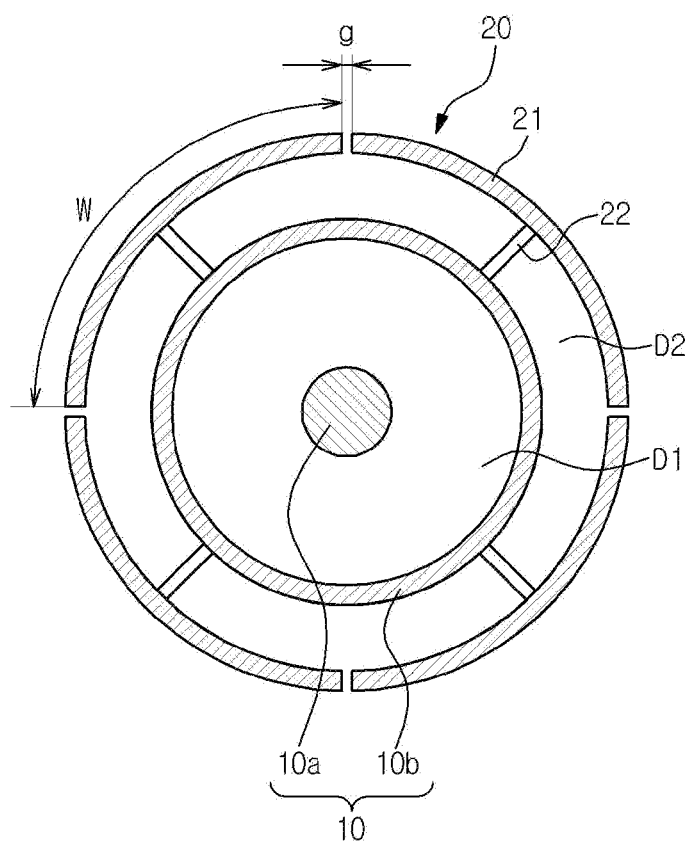
FIG. 4 is a cross-sectional view schematically illustrating the coaxial cable using the cylindrical electromagnetic bandgap, according to an embodiment of the present disclosure.

Referring to FIG. 3 and FIG. 4, the cylindrical electromagnetic bandgap 20 of the present disclosure is provided to cover the outside of the coaxial cable 10.

The cylindrical electromagnetic bandgap 20 includes a conductor patch (or shield) 21 and a via (or connecting link) 22.

Each of the conductor patch 21 and the via 22 is provided in a cylindrical shape to cover the coaxial cable 10, and each of the conductor patch 21 and the via 22 is provided in a plurality to form a nearly complete cylindrical shape.

The conductor patch 21 has a curved surface to be spaced apart by a predetermined gap distance from the outer conductor 10b of the coaxial cable 10.

The conductor patch 21 is coaxially formed in relation to the outer conductor 10b and the inner conductor 10a of the coaxial cable 10.

The via 22 connects the outer conductor 10b of the coaxial cable 10 to the conductor patch 21.

The via 22 extends perpendicularly from an inner surface of the conductor patch having a curved surface, and makes contact with the outer conductor 10b of the coaxial cable 10 to connect the conductor patch 21 and the outer conductor 10b of the coaxial cable 10 both structurally and electrically. The via 22 may be composed of the same material as the conductor patch 21.

A dielectric D2 may be provided between the outer conductor 10b and the conductor patch 21, that is, between the cylindrical electromagnetic bandgap 20 and the coaxial cable 10.

In addition, ferrite material (F) may be provided between the coaxial cable 10 and the cylindrical electromagnetic bandgap 20. That is, the dielectric D1 is formed between the inner conductor 10a and the outer conductor 10b of the coaxial cable 10 while forming ferrite material (F) between the conductor patch 21 and the outer conductor 10b. The dielectric D2 between the outer conductor 10b and the conductor patch 21 may include the same dielectric material as the dielectric D1 or include a predetermined dielectric material that has the same or different dielectric constant as the dielectric D1.

Figure 5:
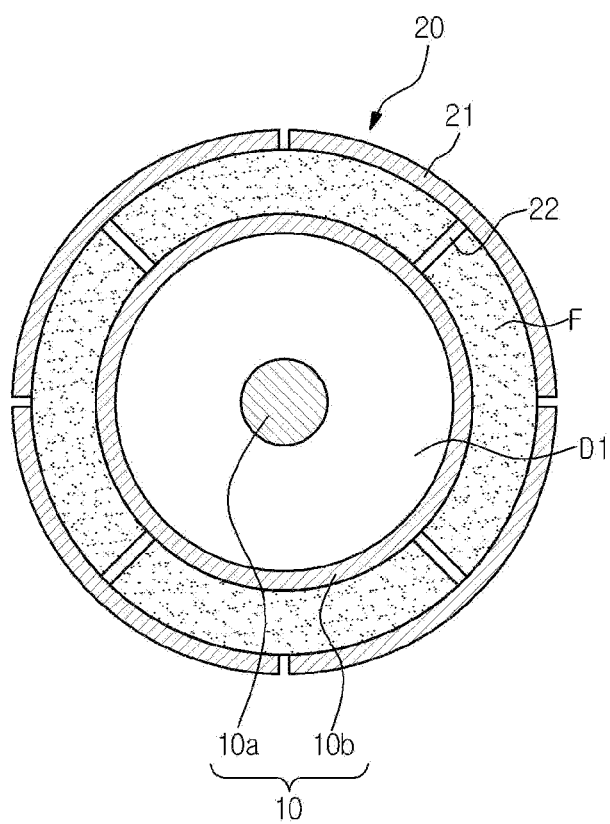
FIG. 5 is a cross-sectional view schematically illustrating a coaxial cable to which a cylindrical electromagnetic bandgap, according to an embodiment of the present disclosure, is applied.

The ferrite material (F) is used as highly permeable magnetic material between a low frequency and several hundred MHz frequency range, and is effective in shielding electromagnetic wave noise of a low frequency (see FIG. 5).

Therefore, the use of dielectrics D1 and D2 and/or ferrite material F result in a decrease of electromagnetic waves both in a low frequency range and a high frequency range.

In addition, according to this embodiment of the present disclosure, the cylindrical electromagnetic bandgap 20 is formed using four conductor patches 21 and four vias 22. However, the number of vias 22 or the conductor patches 21 is not limited to these numbers.

In particular, the frequency characteristic of the cylindrical electromagnetic bandgap 20 may be changed by changing an area (W*L), a thickness, or a gap distance (g) of the conductor patch 21, and therefore, tuning a frequency is possible.

The area (W*L) of the conductor patch 21 is a size of an area that is represented by multiplying a width (W) by a length (L) of the conductor patch 21, while the gap distance (g) represents a gap between adjacent conductor patches 21.

In addition, although not shown, the frequency characteristic of the cylindrical electromagnetic bandgap 20 may be changed by changing an area, a thickness, or a gap distance of the via 22.

Here, the thickness of the via 22 represents a cross-sectional area of the via 22, and the gap distance of the via 22 represents a gap between adjacent vias 22.

Figure 6:
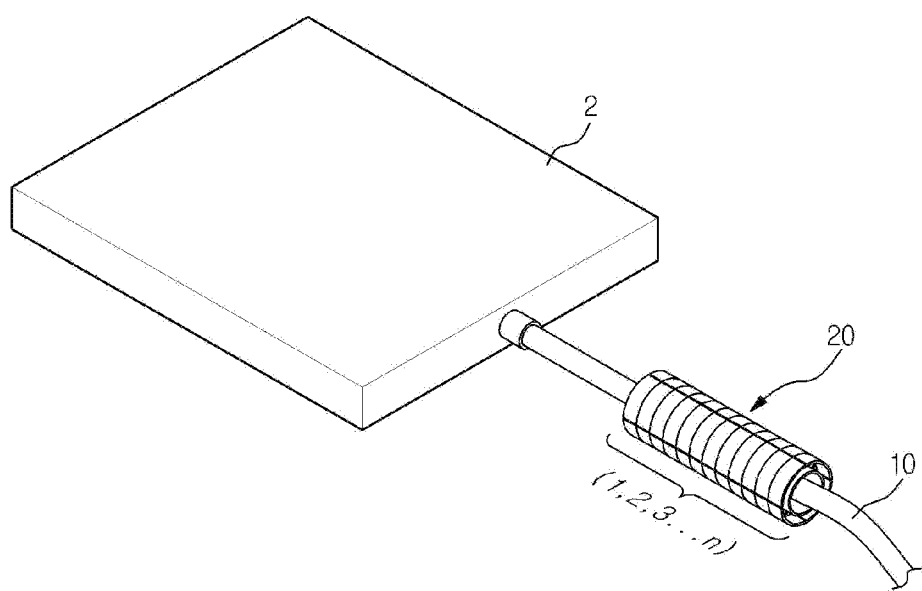
FIG. 6 is a view schematically illustrating the coaxial cable using the cylindrical electromagnetic bandgap, according to an embodiment of the present disclosure.

Therefore, the cylindrical electromagnetic bandgap 20 according to the embodiment of the present disclosure is installed on the coaxial cable 10 that connects the internal wireless apparatus 2 to the antenna (A) inside the electronic device 1, as illustrated in FIG. 6.

The cylindrical electromagnetic bandgap 20 may be formed in plurality of rows (1, 2, 3 . . . n) of cylindrical electromagnetic bandgaps 20 in a longitudinal direction of the coaxial cable 10.

The conductor patches 21 of the cylindrical electromagnetic bandgap 20 are spaced apart in a longitudinal direction of the coaxial cable 10 by a predetermined gap from one another. By changing such gap, the frequency characteristic of the cylindrical electromagnetic bandgap 20 may be changed.

In this configuration, the cylindrical electromagnetic bandgap 20 installed around the coaxial cable 10 can shield electromagnetic wave noise conveyed on the surface of the coaxial cable 10. The cylindrical electromagnetic bandgap 20, when transmitting signals from the coaxial cable 10, can improve signal reduction and reception sensitivity, and therefore, a reception of a wireless function on an electronic apparatus can be improved.

Figure 7A:
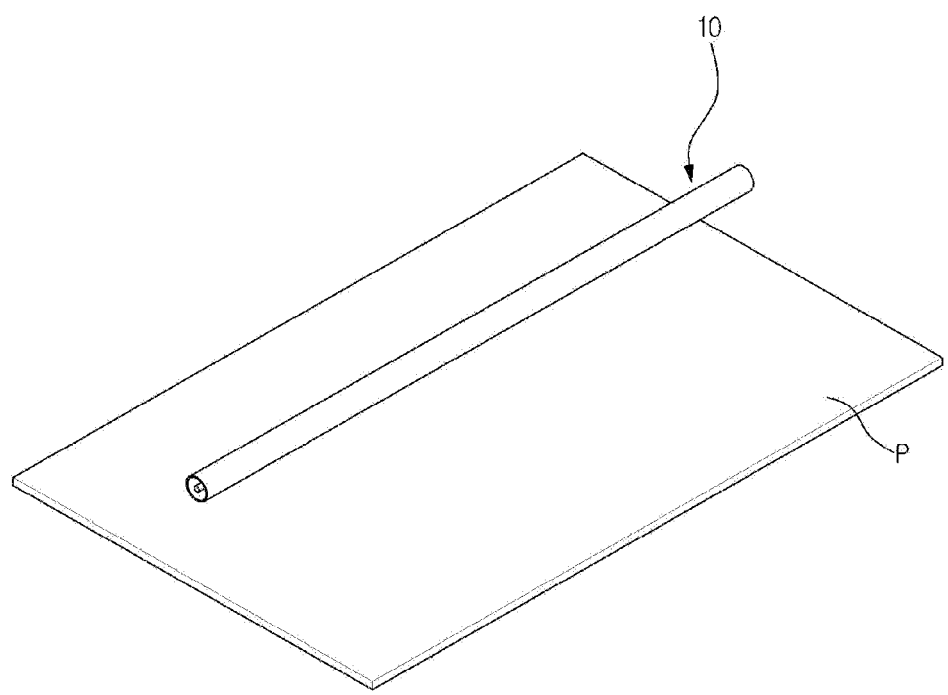
FIGS. 7A, 7B, 8A, and 8B are views that explain a simulation of showing a noise current transfer characteristic in use of the cylindrical electromagnetic bandgap, according to an embodiment of the present disclosure.
Figure 7B:
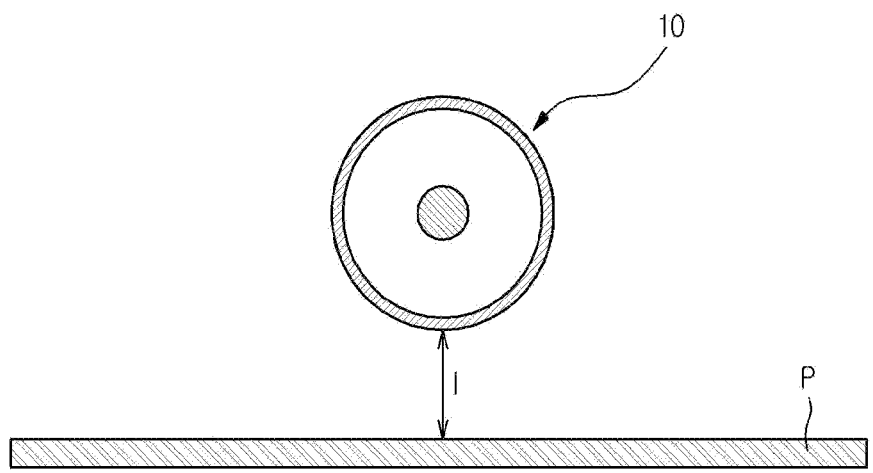
Figure 8A:
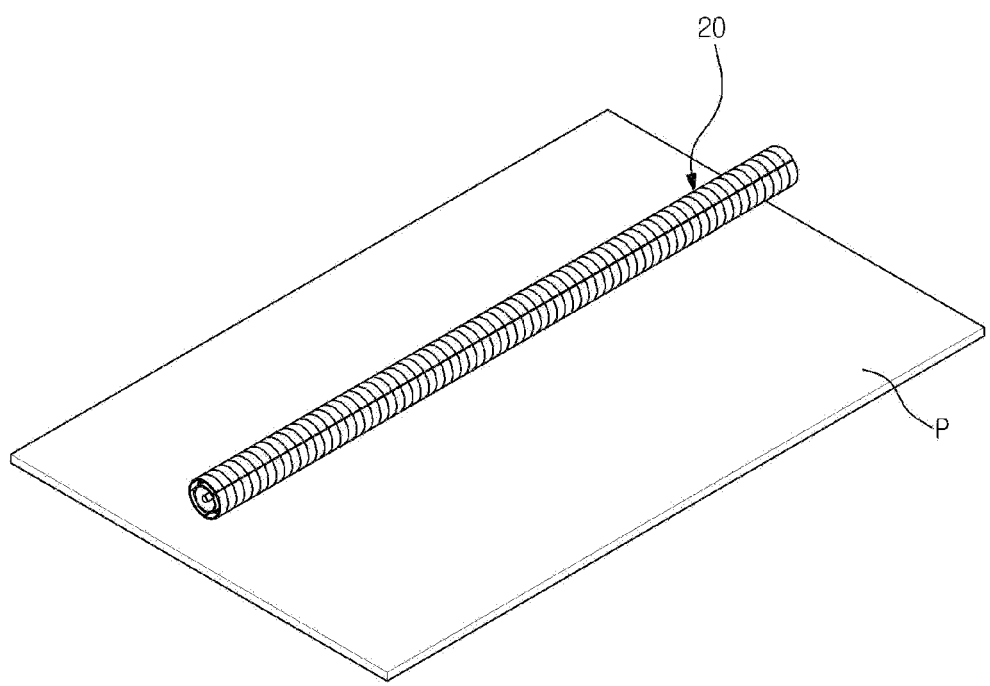
Figure 8B:
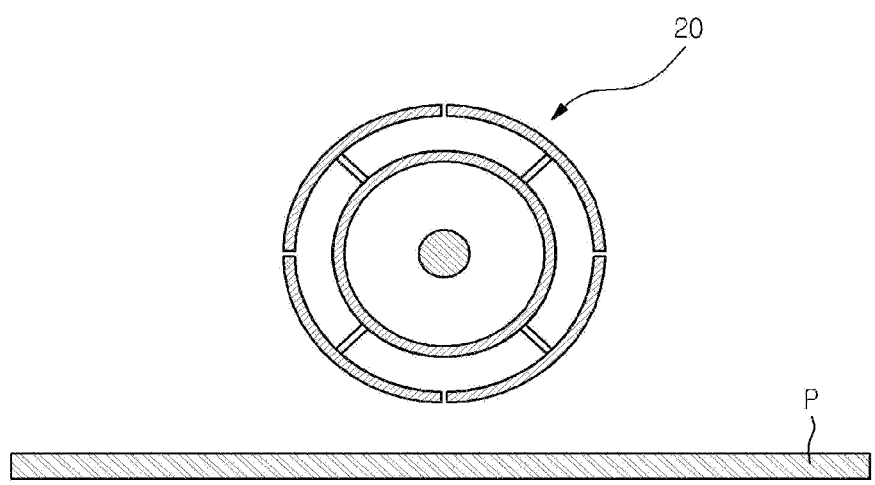

With reference to the case illustrated by FIGS. 7A and 7B where a conventional coaxial cable 10 is placed on a conductor panel (P), and the case illustrated by FIGS. 8A and 8B where the coaxial cable 10 having the cylindrical electromagnetic bandgap 20 is placed on a conductor panel P, ports are established at both ends of the cables to perform a simulation. The simulation is performed to obtain characteristics of electromagnetic wave noise being conveyed between two ports.

The coaxial cable 10 is provided at a height of 7 mm (I) above a ground surface (100*102.1 mm) while having a length of 102.1 mm. The inner conductor has a radius of 0.5 mm, and the outer conductor has a radius of 0.2 mm with a thickness of 0.2 mm.

The cylindrical electromagnetic bandgap 20 is provided to have 4 conductor patches per segment, forming a cylinder with a radius of 4.6 mm and a length of 5.0 mm. In this case, a total number of conductor patches is 80.

The via is set to have a radius of 0.1 mm and a length of 0.1 mm.

Figure 9:
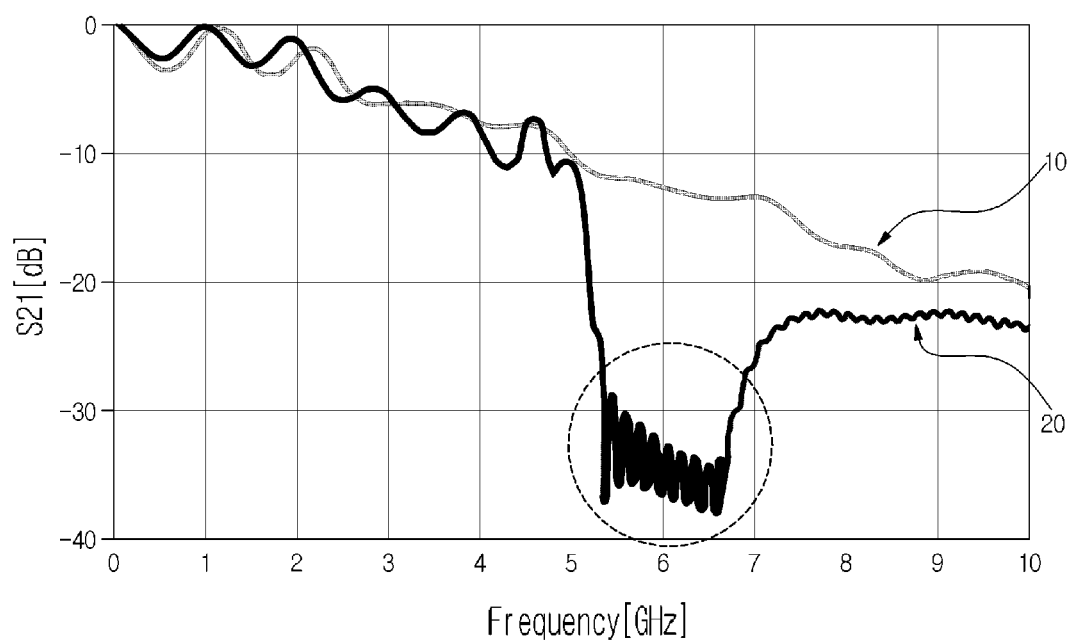
FIG. 9 is a view schematically illustrating a result of noise current transfer characteristics shown in use of the cylindrical electromagnetic bandgap, according to an embodiment of the present disclosure.

FIG. 9 shows a simulation result comparing the coaxial cable 10 with the cylindrical electromagnetic bandgap 20 according to the embodiment of the present disclosure. As seen, the electromagnetic noise transfer characteristic is reduced compared to a conventional coaxial cable by more than 20 dB (marked as dotted line on FIG. 9) in frequencies in the range of approximately 5 GHz to approximately 6 GHz, which corresponds to a wireless LAN (local area network) band.

Therefore, in a case when the coaxial cable 10 is adopted with the cylindrical electromagnetic bandgap 20, it is determined that a reception of the WLAN band can be improved by more than 20 dB compared to a conventional coaxial cable.

In addition, the frequency characteristic of such frequency band can be changed by adjusting an area, a thickness, or a gap of each of the conductor patch 21 and the via 22 that together form the cylindrical electromagnetic bandgap 20.

Figure 10:
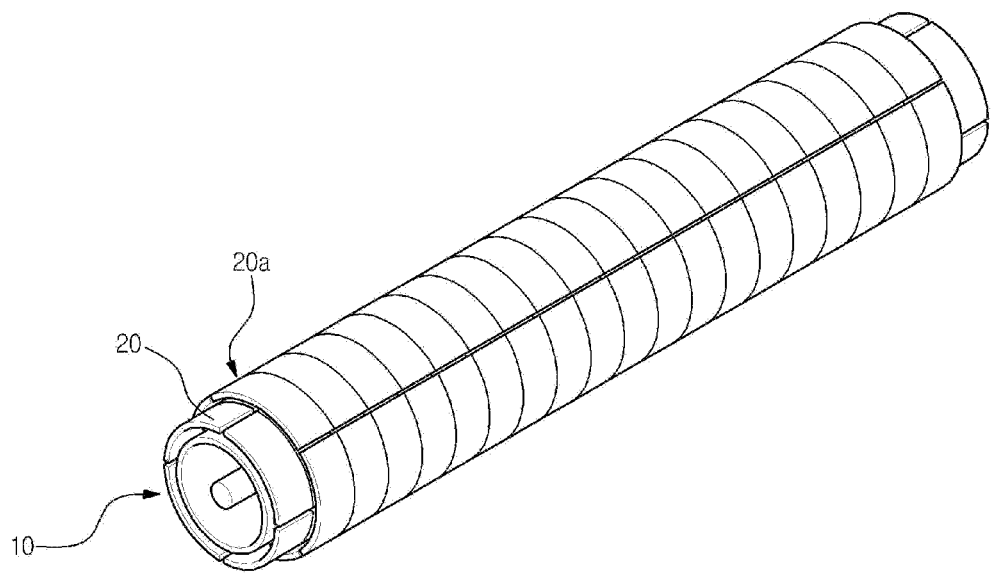
FIGS. 10 and 11 are views schematically illustrating the coaxial cable using the cylindrical electromagnetic bandgap, according to an embodiment of the present disclosure.
Figure 11:
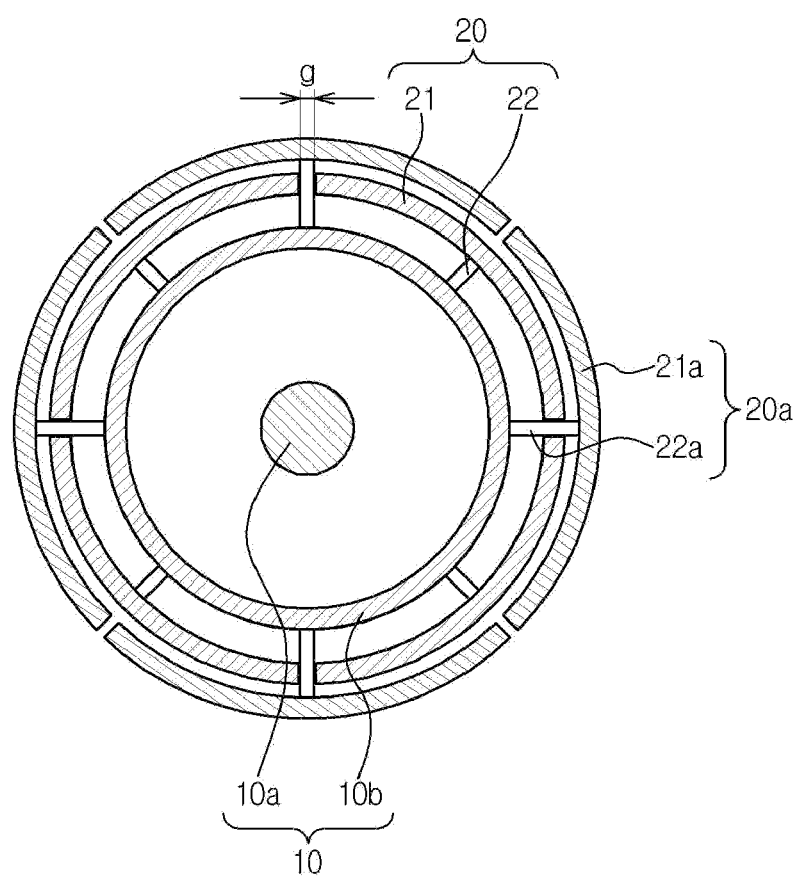

Referring to FIGS. 10 and 11, a cylindrical electromagnetic bandgap according to an embodiment of the present disclosure has a stacking structure that covers an outer side of the cylindrical electromagnetic bandgap 20 that covers the coaxial cable 10.

The cylindrical electromagnetic bandgap with a stacking structure includes a first cylindrical electromagnetic bandgap 20 that is formed in a cylindrical shape to cover the outer conductor 10b of the coaxial cable 10, and a second cylindrical electromagnetic bandgap 20a that covers the first cylindrical electromagnetic bandgap 20.

The second cylindrical electromagnetic bandgap 20a also includes a conductor patch 21a having a curved surface and a via 22a connecting the conductor patch 21a to the outer conductor 10b of the cylindrical cable 10.

A gap (g) is present between a plurality of conductor patches 21 of the first cylindrical electromagnetic bandgap 20. The via 22a of the second cylindrical electromagnetic bandgap 20a is inserted into the gap (g) and connects an outer conductor 10b of the coaxial cable 10 to a conductor patch 21a of the second cylindrical electromagnetic bandgap 20a both structurally and electrically.

The second cylindrical electromagnetic bandgap 20a is provided so that a portion of the conductor patch 21a of the second cylindrical electromagnetic bandgap 20a overlaps with a portion of the conductor patch 21 of the first cylindrical electromagnetic bandgap 20, and therefore, has a characteristic as a bandgap for broadband electromagnetic waves.

Between the first and the second cylindrical electromagnetic bandgaps 20 and 20a and the coaxial cable 10, that is, between each conductor patch 21 and 21a and the outer conductor patch 10b, the dielectric D2 or ferrite material F can be formed. Therefore, the first and second cylindrical electromagnetic bandgaps 20 and 20a can have a characteristic in reduced electromagnetic waves both in a low frequency band and in a high frequency band.

Although a few embodiments of the present disclosure have been shown and described, it would be appreciated by those skilled in the art that changes may be made in these embodiments without departing from the principles and spirit of the disclosure, the scope of which is defined in the claims and their equivalents. For example, the cylindrical electromagnetic bandgap of the present disclosure can be applied to a cylindrical cable by use of a structure and material that can block the flow of organic currents instead of a conductor patch and a via. Therefore, changes and modifications made in these embodiments without departing from the principles and spirit of the disclosure are to be included in the claim.

What is claimed is:
1. A cylindrical electromagnetic bandgap provided in a cylindrical shape to prevent a flow of induced currents on a conductive surface of a cylindrical cable, the cylindrical electromagnetic bandgap comprising:
- a conductor patch having a curved surface to be spaced apart from the conductive surface of the cylindrical cable to an outer side by a predetermined gap distance; and
- a via connecting the conductive surface of the cylindrical cable to the conductor patch.

2. The cylindrical electromagnetic bandgap of claim 1, wherein the cylindrical electromagnetic bandgap is provided in a plurality while being spaced apart from each other lengthwise along the cylindrical cable by a predetermined distance.

3. The cylindrical electromagnetic bandgap of claim 1, wherein at least one of a dielectric and a ferrite material is provided between the outer surface of the cylindrical cable and the conductor patch.

4. The cylindrical electromagnetic bandgap of claim 1, wherein a frequency characteristic of the cylindrical electromagnetic bandgap is adjusted according to the change of an area of at least one of the conductor patch and the via.

5. The cylindrical electromagnetic bandgap of claim 1, wherein a frequency characteristic of the cylindrical electromagnetic bandgap is adjusted according to the change in thickness of at least one of the conductor patch and the via.

6. The cylindrical electromagnetic bandgap of claim 1, wherein a frequency characteristic of the cylindrical electromagnetic bandgap is adjusted according to the change in a gap of at least one of the conductor patch and the via.

7. The cylindrical electromagnetic bandgap of claim 1, wherein the cylindrical electromagnetic bandgap is provided in a stacking structure so that a portion of a conductor patch of one cylindrical electromagnetic bandgap overlaps with a portion of a conductor path of another cylindrical electromagnetic bandgap.

8. An electromagnetic bandgap for reducing electromagnetic interference of a cable, the electromagnetic bandgap comprising:
- a conductor patch having a curved surface to be spaced apart from a surface of the cable to an outer side by a predetermined gap distance; and
- a via connecting the conductor patch to a conductive surface of the cable,
- wherein the conductor patch is provided in a plurality of cylindrical conductor patches that are arranged at an equal interval and the via is provided in a plurality of cylindrical vias that are arranged at an equal interval.

9. The electromagnetic bandgap of claim 8, wherein the electromagnetic bandgap is provided in a plural of rows of electromagnetic bandgaps while being spaced apart from each other lengthwise along the cable by a predetermined distance.

10. The electromagnetic bandgap of claim 8, wherein a frequency characteristic of the electromagnetic bandgap is adjusted according to the change of at least one of area, thickness, and gap distance of the conductor patch or the via.

11. The electromagnetic bandgap of claim 8, wherein at least one of a dielectric and a ferrite material is provided between the conductor patch and the cable.

12. A coaxial cable having an inner conductor and an outer conductor provided outside the inner conductor, the coaxial cable comprising:
- a cylindrical electromagnetic bandgap which is formed at an outer side of the coaxial cable to block noise current induced on a surface of the coaxial cable,
- wherein the cylindrical electromagnetic bandgap comprises a plurality of conductor patches having a curved surface to be spaced apart from an outer side of the outer conductor by a predetermined gap distance, and
- wherein the plurality of conductor patches are spaced apart in a longitudinal direction of the coaxial cable by a predetermined gap from one another.

13. The coaxial cable of claim 12, wherein the cylindrical electromagnetic bandgap comprises a via connecting the conductor patch to the outer conductor.

14. The coaxial cable of claim 13, wherein each of the conductor patch and the via is provided in a cylindrical shape such that the cylindrical electromagnetic bandgap covers around the cable.

15. The coaxial cable of claim 12, wherein the cylindrical electromagnetic bandgap is provided in a plurality of rows of cylindrical electromagnetic bandgaps arranged lengthwise along the cable.

16. The coaxial cable of claim 12, wherein a frequency characteristic of the cylindrical electromagnetic bandgap is adjusted according to the change of at least one of area, thickness, and gap distance of the conductor patch or the via.

17. The coaxial cable of claim 12, wherein at least one of a dielectric and a ferrite material is provided between the outer conductor and the conductor patch.

18. The coaxial cable of claim 12, wherein the cylindrical electromagnetic bandgap is provided in a stacking structure so that a portion of a conductor patch of one cylindrical electromagnetic bandgap overlaps with a portion of a conductor path of another cylindrical electromagnetic bandgap.

* * * * *